(12) United States Patent
Matsumoto

(10) Patent No.: US 11,841,399 B2
(45) Date of Patent: Dec. 12, 2023

(54) DIAGNOSTIC APPARATUS FOR SWITCHING DEVICE

(71) Applicant: Mitsubishi Electric Corporation, Tokyo (JP)

(72) Inventor: Daigo Matsumoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 247 days.

(21) Appl. No.: 17/419,056

(22) PCT Filed: Feb. 13, 2019

(86) PCT No.: PCT/JP2019/005152
§ 371 (c)(1),
(2) Date: Jun. 28, 2021

(87) PCT Pub. No.: WO2020/165975
PCT Pub. Date: Aug. 20, 2020

(65) Prior Publication Data
US 2022/0074990 A1 Mar. 10, 2022

(51) Int. Cl.
*G01R 31/327* (2006.01)
*H01H 9/54* (2006.01)

(52) U.S. Cl.
CPC ........... *G01R 31/327* (2013.01); *H01H 9/54* (2013.01)

(58) Field of Classification Search
CPC .............. G01R 31/327; G01R 31/3274; G01R 31/3277; H01H 9/54; H01H 1/00;
(Continued)

(56) References Cited

U.S. PATENT DOCUMENTS

2012/0053886 A1  3/2012  Poeltl
2017/0047184 A1  2/2017  Ashtekar et al.

FOREIGN PATENT DOCUMENTS

CN   106019138 B   10/2018
CN   109270441 A   1/2019
(Continued)

OTHER PUBLICATIONS

Extended European Search Report dated Jan. 27, 2022, issued in European Patent Application No. 19915246.3, 12 pages.
(Continued)

*Primary Examiner* — Son T Le
(74) *Attorney, Agent, or Firm* — BUCHANAN INGERSOLL & ROONEY PC

(57) ABSTRACT

A diagnostic apparatus for switching device diagnoses whether any anomalies occurs in a switching device including an operation shaft that opens and closes a circuit breaker contact serving as a contact. The diagnostic apparatus for switching device includes: a gradient calculation unit that calculates a gradient of a waveform that indicates motion of the operation shaft and represents a relationship between a position of the operation shaft and a time that elapses since an operating command has been input to the switching device; and an anomaly diagnosis unit that extracts, from a relationship between the time and the gradient calculated, a feature value representing a motion characteristic of the operation shaft and diagnoses whether an anomaly occurs and a factor behind the anomaly that occurs, on the basis of a result of comparison between the extracted feature value and a preset reference value.

4 Claims, 4 Drawing Sheets

(58) Field of Classification Search
CPC .......... H01H 1/0015; H01H 3/24; H01H 3/60;
H01H 3/605; H01H 9/56; H01H 2009/56;
H01H 2009/566; H01H 11/00; H01H
11/0062
See application file for complete search history.

(56) References Cited

FOREIGN PATENT DOCUMENTS

| | | |
|---|---|---|
| JP | 2004192441 A | 7/2004 |
| JP | 2011258366 A | 12/2011 |

OTHER PUBLICATIONS

International Search Report (PCT/ISA/210) with translation and Written Opinion (PCT/ISA/237) dated May 7, 2019, by the Japan Patent Office as the International Searching Authority for International Application No. PCT/JP2019/005152.

|   | CRITERION | ANOMALY | | | |
|---|---|---|---|---|---|
|   |   | TYPE A | TYPE B | TYPE C | TYPE D |
| X | $t_{X1}-t_{X0}<T_1$ | UNFULFILLED | UNFULFILLED | | |
|   | $|g_1-g_0|<G$ | | UNFULFILLED | | |
| Y | $t_{Y1}-t_{Y0}<T_2$ | UNFULFILLED | UNFULFILLED | UNFULFILLED | |
|   | $T_3<t_{Y1}-t_{Y0}$ | | | | UNFULFILLED |

DIAGNOSTIC APPARATUS FOR SWITCHING DEVICE

FIELD

The present invention relates to a diagnostic apparatus that diagnoses, for a switching device, whether any anomalies have occurred in the switching device that opens and closes a contact.

BACKGROUND

Operating characteristics of a switching device such as a circuit breaker or a disconnector can change due to aging of a drive source or a mechanism that is used for switching operation, compared to beginnings of use of the switching device. A change in the operating characteristics emerges in a waveform that represents a relationship between a time and a position of an operation shaft that opens and closes a contact. Such a waveform is referred to as a travel waveform in a description below.

For diagnosis of whether an anomaly has occurred in a switching device and an anomaly type, a diagnostic apparatus disclosed in Patent Literature 1 detects stroke displacement of an operation shaft that opens and closes main contacts. The diagnostic apparatus according to Patent Literature 1 uses a drum switch to detect the stroke displacement in switching operation inspection and also detects switching states of two non-voltage contacts in the drum switch. The two non-voltage contacts refer to a first contact and a second contact. The first contact opens concurrently with a start of opening operation of a main contact. The second contact closes concurrently with completion of the opening operation of the main contact. The diagnostic apparatus according to Patent Literature 1 also obtains an operating command that is output to the switching device. For comparison between normal stroke displacement and the detected stroke displacement, the diagnostic apparatus according to Patent Literature 1 associates a travel waveform that serves as a result of the stroke displacement detection with a timing at which the operating command has been output, a timing at which the first contact has opened, and a timing at which the second contact has closed.

CITATION LIST

Patent Literature

Patent Literature 1: Japanese Patent Application Laid-open No. 2011-258366

SUMMARY

Technical Problem

When using the above technique described in Patent Literature 1 in diagnosis of whether an anomaly has occurred, a diagnostic apparatus needs to obtain a signal serving as an operating command and a signal indicating a switching between opening and closing of each of non-voltage contacts, in addition to detecting a travel waveform. Moreover, the diagnostic apparatus needs to associate these signals with the travel waveform in the diagnosis using the above technique described in Patent Literature 1. Therefore, a processing load on the diagnostic apparatus according to Patent Literature 1 that is required for the diagnosis is problematically difficult to reduce.

The present invention has been made in view of the above, and an object of the present invention is to obtain a diagnostic apparatus for switching device. This diagnostic apparatus enables a reduced processing load in diagnosis.

Solution to Problem

A diagnostic apparatus for switching device according to an aspect of the present invention diagnoses whether an anomaly occurs in a switching device including an operation shaft that opens and closes a contact. The diagnostic apparatus for switching device according to the present invention includes: a gradient calculation unit that calculates a gradient of a waveform that indicates motion of the operation shaft and represents a relationship between a position of the operation shaft and a time that elapses since an operating command has been input to the switching device; and an anomaly diagnosis unit that extracts, from a relationship between the time and the gradient calculated, a feature value representing a motion characteristic of the operation shaft and diagnoses whether an anomaly occurs and a factor behind the anomaly that occurs, on the basis of a result of comparison between the extracted feature value and a preset reference value.

Advantageous Effects of Invention

The present invention enables a reduced processing load in diagnosis.

DESCRIPTION OF EMBODIMENT

With reference to the drawings, a detailed description is hereinafter provided of a diagnostic apparatus for switching device according to an embodiment of the present invention. It is to be noted that this embodiment does not restrict the present invention.

First Embodiment

Figure 1:
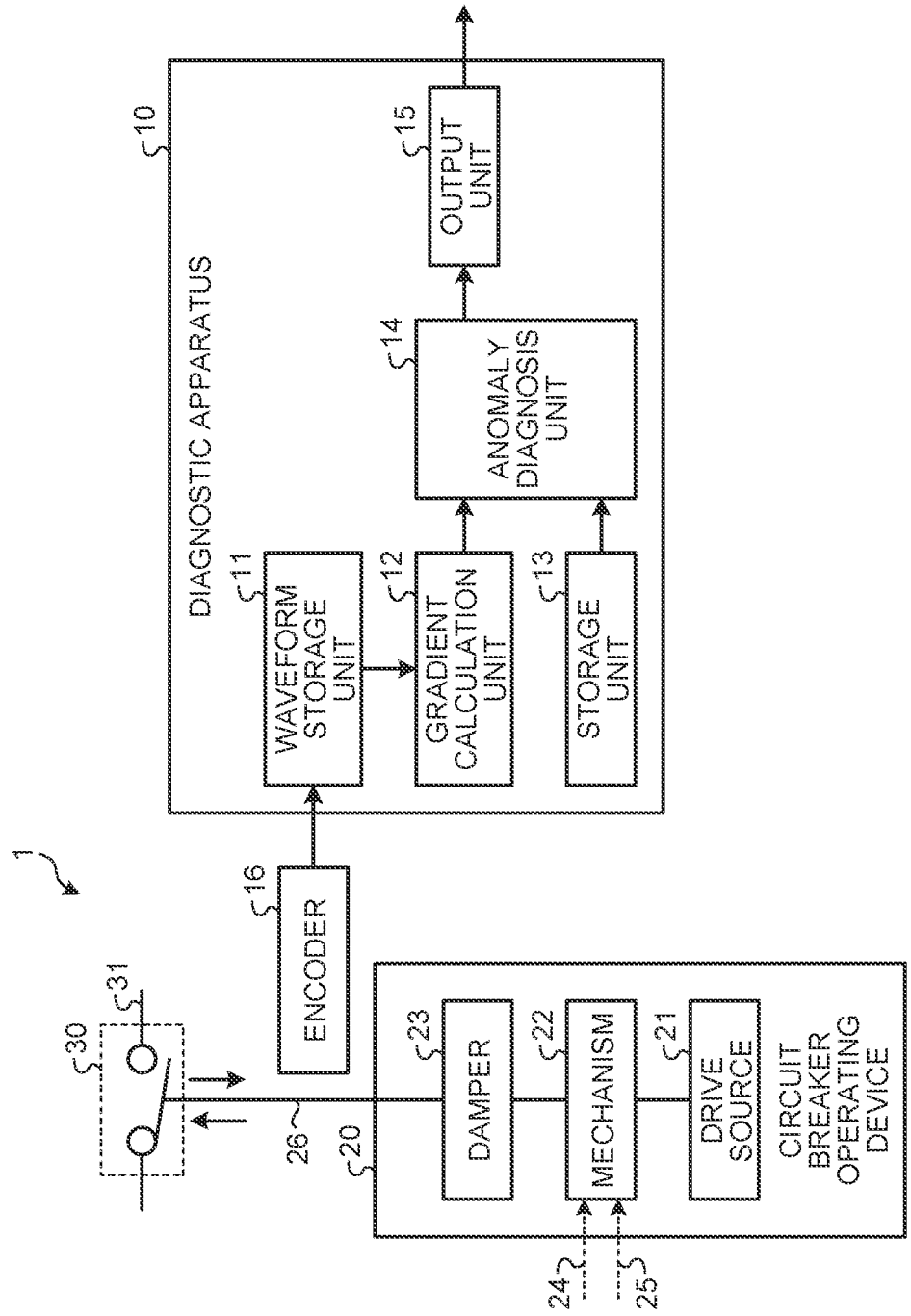
FIG. 1 illustrates a diagnostic apparatus for switching device according to a first embodiment of the present invention, and the switching device that is subjected to diagnosis by the diagnostic apparatus for switching device.

FIG. 1 illustrates a diagnostic apparatus for switching device according to the first embodiment of the present invention, and the switching device that is subjected to diagnosis by the diagnostic apparatus for switching device. The diagnostic apparatus 10 for a switching device diagnoses whether any anomalies have occurred in the switching device that opens and closes a contact. The switching device is, for example, a circuit breaker or a disconnector. The switching device illustrated in FIG. 1 is a circuit breaker 1, which is given as an example.

The circuit breaker 1 includes a circuit breaker operating device 20. The circuit breaker operating device operates a circuit breaker contact 30 that is a contact provided in a circuit 31 of a facility such as a substation or a switchyard. The circuit 31 is opened as the circuit breaker contact 30 is opened. As the circuit breaker contact 30 is closed, the circuit 31 is closed. The circuit breaker operating device 20 performs a tripping operation for opening the circuit breaker contact 30 and a closing operation for closing the circuit breaker contact 30.

The circuit breaker operating device 20 includes an operation shaft 26 that opens and closes the circuit breaker contact 30 in the tripping and closing operations, a mechanism 22 that operates the operation shaft 26, a drive source 21 that drives the mechanism 22, and a damper that brakes the tripping operation and the closing operation. The drive source 21 uses air pressure or oil pressure to drive the mechanism 22. The damper 23 absorbs shock of the operation shaft 26 by braking the operation shaft 26 when the tripping operation and the closing operation are about to end. A dashpot is usable as the damper 23.

With the circuit 31 in a closed state, the pressure for the tripping operation is accumulated in the drive source 21. The tripping operation is locked by a tripping latch mechanism of the mechanism 22. With the circuit 31 in an open state, the pressure for the closing operation is accumulated in the drive source 21. The closing operation is locked by a closing latch mechanism of the mechanism 22. The tripping latch mechanism and the closing latch mechanism are not illustrated in FIG. 1.

The tripping operation is controlled by a control signal 24 serving as an operating command for the tripping operation. The closing operation is controlled by a control signal 25 serving as an operating command for the closing operation. A control panel that controls the circuit breaker operating device 20 outputs the control signals 24 and 25 to the circuit breaker operating device 20. The control panel is not illustrated in FIG. 1.

When the control signal 24 is input to the mechanism 22, the mechanism 22 undoes the lock of the tripping latch mechanism. Undoing the lock of the tripping latch mechanism causes the circuit breaker operating device to perform the tripping operation. When the control signal 25 is input to the mechanism 22, the mechanism 22 undoes the lock of the closing latch mechanism. Undoing the lock of the closing latch mechanism causes the circuit breaker operating device 20 to perform the closing operation.

An encoder 16 detects a position of the operation shaft 26. A linear encoder is an example of the encoder 16 and when attached to the operation shaft 26, detects the position of the operation shaft 26 along a straight line. The encoder 16 may be a rotary encoder. In that case, linear motion of the operation shaft 26 is converted to rotational motion. The rotary encoder is attached to a rotating shaft that rotates in association with the rotational motion. The rotary encoder detects the position of the operation shaft 26 by detecting a rotation amount of the rotating shaft. The encoder 16 outputs, to the diagnostic apparatus 10, a signal indicating a result of the position detection of the operation shaft 26.

The diagnostic apparatus 10 includes a waveform storage unit 11 that stores a travel waveform, a gradient calculation unit 12 that calculates gradients of the travel waveform read from the waveform storage unit 11, an anomaly diagnosis unit 14 that diagnoses whether any anomalies have occurred and a factor behind an anomaly that has occurred, a storage unit 13 storing reference values that the anomaly diagnosis unit 14 refers to in the diagnosis, and an output unit 15 that outputs a diagnostic result of the anomaly diagnosis unit 14.

The waveform storage unit 11 obtains the signal indicating the detection result of the encoder 16. The waveform storage unit 11 generates the travel waveform based on the obtained signal and stores the travel waveform thus generated. The travel waveform shows the motion of the operation shaft 26 and represents a relationship between the position of the operation shaft 26 and a time. The time is a time elapsed since the operating command has been input to the circuit breaker operating device 20. The gradient calculation unit 12 reads the travel waveform stored in the waveform storage unit 11 and calculates the gradients of the read travel waveform. The gradient calculation unit 12 outputs a result of the gradient calculation to the anomaly diagnosis unit 14.

The reference values are preset and stored in the storage unit 13. The anomaly diagnosis unit 14 reads the reference values stored in the storage unit 13. From a relationship between the gradients calculated by the gradient calculation unit 12 and the time, the anomaly diagnosis unit 14 extracts feature values representing motion characteristics of the operation shaft 26. The anomaly diagnosis unit 14 compares the extracted feature values with the read reference values. On the basis of a comparison result, the anomaly diagnosis unit 14 diagnoses whether any anomalies have occurred and the factor behind the anomaly that has occurred.

The output unit 15 outputs, to the above-mentioned control panel, information serving as the diagnostic result of the anomaly diagnosis unit 14. The output unit 15 may output the diagnostic result to a device other than the control panel. The diagnostic apparatus 10 may include a display unit that displays the diagnostic result. The diagnostic result may be sent out from the diagnostic apparatus 10 in addition to being displayed by the display unit of the diagnostic apparatus 10.

Figure 2:
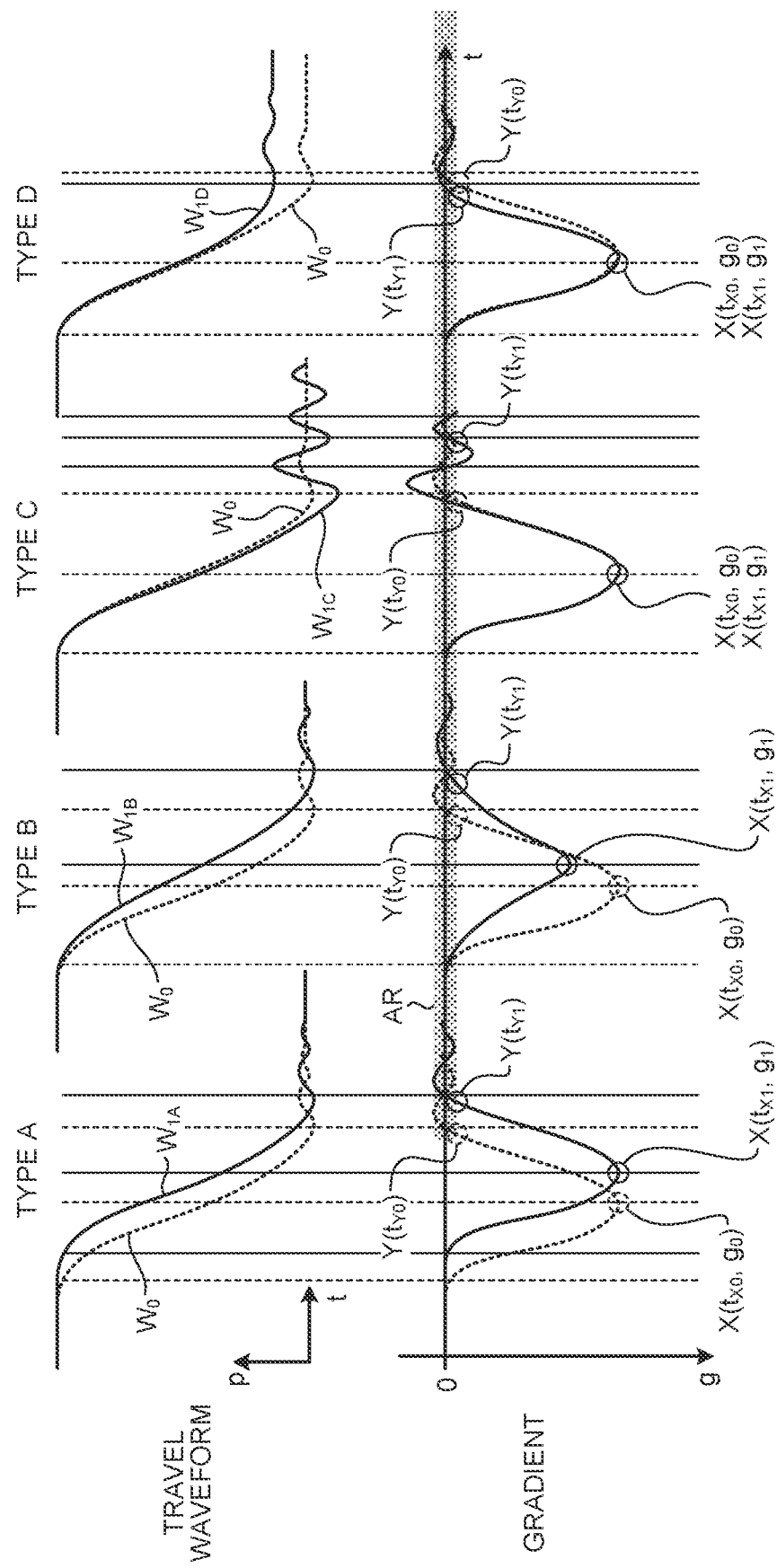
FIG. 2 illustrates diagnoses that an anomaly diagnosis unit of the diagnostic apparatus for switching device illustrated in FIG. 1 makes.

A description is provided next of the diagnosis by the anomaly diagnosis unit 14. FIG. 2 illustrates diagnoses that the anomaly diagnosis unit of the diagnostic apparatus for switching device illustrated in FIG. 1 makes. On the basis of the feature values obtained from the gradients of the travel waveform, the diagnostic apparatus diagnoses whether any anomalies have occurred for each factor.

In the presence of an anomaly, features that depend on a factor contributing to the anomaly can emerge in a travel waveform. Travel waveforms $W_{1A}$, $W_{1B}$, $W_{1C}$, and $W_{1D}$ are depicted as examples in a top row of FIG. 2, suggesting respective anomalies that are caused by four factors. In FIG. 2, each of the travel waveforms $W_{1A}$, $W_{1B}$, $W_{1C}$, and $W_{1D}$ of each type is denoted by solid lines. A normal travel waveform $W_0$ is denoted by a broken line. Each travel waveform in FIG. 2 is a travel waveform in the tripping operation. A vertical axis of graphs showing the travel waveforms represents the position p of the operation shaft 26. A horizontal axis of the graphs represents a time t. The time t is an elapsed time that has passed from input of the control signal 24 to the circuit breaker operating device 20.

Graphs are depicted in a bottom row of FIG. 2, each showing a relationship between a gradient g of the travel waveform and the time t. Those graphs of FIG. 2 that relate to the travel waveforms $W_{1A}$, $W_{1B}$, $W_{1C}$, and $W_{1D}$ are denoted by solid lines. The graphs relating to the travel waveform $W_0$ are denoted by a broken line. A vertical axis of the graphs represents the gradient g. A horizontal axis of the graphs represents the time t.

The travel waveform $W_{1A}$ of "type A" is a travel waveform when an anomaly is caused by a late start of the operation shaft 26 in moving. The operation shaft 26 can have a late start in moving when movable parts of the switching device are less smooth. The movable parts include the latch mechanism and a part of the mechanism 22 that operates upon receiving driving force from the drive source 21 of the circuit breaker operating device 20. The movable parts also include a linkage between the mechanism and the operation shaft 26, and a linkage between the operation shaft 26 and the circuit breaker contact 30. The term "less smooth" refers to sluggish movement of the movable part. The term "less smooth" includes insufficient lubrication of the movable part. The insufficient lubrication can result from deterioration of grease applied to the movable part or lack of grease. The term "less smooth" also includes a state in which the movable part has its movement hindered by a stuck component of the movable part.

When the operation shaft 26 has a late start in moving, there is a long time interval between the input of the operating command and a time when the operation shaft starts moving, compared to when the operation shaft 26 starts moving without a delay. Therefore, compared with the travel waveform $W_0$, the travel waveform $W_{1A}$ has a late change in the position p. There is no difference in moving speed of the operation shaft 26 between the case where the operation shaft 26 has the late start in moving and the case where the operation shaft 26 starts moving without the delay. Therefore, changes in the gradient of the travel waveform $W_{1A}$ coincide with changes in the gradient of the travel waveform $W_0$. The travel waveform $W_{1A}$ has a longer time from the input of the operating command to a time when the position p settles, compared with the travel waveform $W_0$.

The travel waveform $W_{1B}$ of "type B" is a travel waveform when an anomaly is caused by a decrease in the driving force of the drive source 21. The decrease in the driving force includes a decrease in the air pressure or a decrease in the oil pressure. There is no difference as to when the operation shaft 26 starts moving between the case where there is the decrease in the driving force and the case where there is no decrease in the driving force. When there is the decrease in the driving force, the moving speed of the operation shaft 26 decreases, compared to when there is no decrease in the driving force. Therefore, compared with the travel waveform $W_0$, the travel waveform $W_{1B}$ slopes gently between a time when the operation shaft starts moving and a time when its movement is settled. The travel waveform $W_{1B}$ has a longer time from the input of the operating command to the time when the position p settles, compared with the travel waveform $W_0$.

The travel waveform $W_{1C}$ of "type C" is a travel waveform when an anomaly is caused by a decrease in braking performance of the damper 23. There is no difference as to when the operation shaft 26 starts moving between the case where there is the decrease in the braking performance and the case where there is no decrease in the braking performance. When there is the decrease in the braking performance, the operation shaft 26 has a bigger reciprocating motion until the movement of the operation shaft 26 is settled, compared to when there is no decrease in the braking performance. Therefore, the travel waveform $W_{1C}$ has a longer time from the input of the operating command to a time when the position p settles, compared with the travel waveform $W_0$.

The travel waveform $W_{1D}$ of "type D" is a travel waveform when an anomaly is caused by an insufficient separation during opening. The separation refers to a separation between a movable contact and a stationary contact in the circuit breaker contact 30. The insufficient separation can be due to faulty adjustment in assembly of the circuit breaker contact 30, namely, initial failure. In the presence of this anomaly, the movement of the operation shaft 26 is settled before the movable contact attains a normal separation in the tripping operation. Therefore, the travel waveform $W_{1D}$ has a shorter time from the input of the operating command to a time when the position p settles, compared with the travel waveform $W_0$.

In each of the graphs that shows the relationship between the gradient g and the time t, a point X is an inflection point in the graph where the gradient g is maximum. A point Y indicates when the movement of the operation shaft 26 is settled. The term "the movement is settled" refers to variation of the gradient g settling into a certain range around zero. An area AR illustrated in FIG. 2 denotes this range.

Features that depend on the factors ranging from the "type A" to the "type D" emerge at the points X and Y on each of the travel waveforms $W_{1A}$, $W_{1B}$, $W_{1C}$, and W. The anomaly diagnosis unit 14 compares the point X on each of the travel waveforms $W_{1A}$, $W_{1B}$, $W_{1C}$, and $W_{1D}$ with the point X on the travel waveform $W_0$, compares the point Y on each of the travel waveforms $W_{1A}$, $W_{1B}$, $W_{1C}$, and $W_{1D}$ with the point Y on the travel waveform $W_0$ and diagnoses whether any anomalies have occurred and the factor behind the anomaly on the basis of a comparison result.

The comparison with the travel waveform $W_0$ shows that the operation shaft 26 has the late start in moving since the input of the operating command in the case of the travel waveform $W_{1A}$. Therefore, "$t_{x1}$" denoting a time t at the point X on the travel waveform $W_{1A}$ is shifted, coming after "$t_{x0}$" that denotes a time t at the point X on the travel waveform $W_0$. In both of the cases of the travel waveforms $W_{1A}$ and $W_0$, the moving speeds of the operation shaft 26 are the same. Therefore, "$g_1$" denoting the gradient g at the point X on the travel waveform $W_{1A}$ is equal to "$g_0$" that denotes the gradient g at the point X on the travel waveform $W_0$. Moreover, "$t_{y1}$" denoting a time t at the point Y on the travel waveform $W_{1A}$ is shifted, coming after "$t_{y0}$" that denotes a time t at the point Y on the travel waveform $W_0$.

The operation shaft 26 has the decreased moving speed in the case of the travel waveform $W_{1B}$ compared to the case of the travel waveform $W_0$. Therefore, "$t_{x1}$" denoting a time t at the point X on the travel waveform $W_{1B}$ is shifted, coming after "$t_{x0}$", which denotes the time t at the point X on the travel waveform $W_0$. "$g_1$" denoting the gradient g at the point X on the travel waveform $W_{1B}$ is smaller than the gradient "$g_0$" at the point X on the travel waveform $W_0$. Moreover, "$t_{y1}$" denoting a time t at the point Y on the travel waveform $W_{1B}$ is shifted, coming after "$t_{y0}$", which denotes the time t at the point Y on the travel waveform $W_0$.

The point X on the travel waveform $W_{1C}$ and the point X on the travel waveform $W_0$ coincide to each other. The travel waveform $W_{1C}$ has the longer time from the input of the operating command to the time when the movement of the operation shaft 26 is settled, compared with the case of the travel waveform $W_0$. Therefore, "$t_{y1}$" denoting a time t at the point Y on the travel waveform $W_{1C}$ is shifted, coming after "$t_{y0}$", which denotes the time t at the point Y on the travel waveform $W_0$.

The point X on the travel waveform $W_{1D}$ and the point X on the travel waveform $W_0$ coincide to each other. The travel waveform $W_{1D}$ has the shorter time from the input of the operating command to the time when the movement of the operation shaft 26 is settled, compared with the case of the travel waveform $W_0$. Therefore, "$t_{y1}$" denoting a time t at the point Y on the travel waveform $W_{1D}$ is shifted, coming before "$t_{y0}$", which denotes the time t at the point Y on the travel waveform $W_0$.

Figures 3, 4:
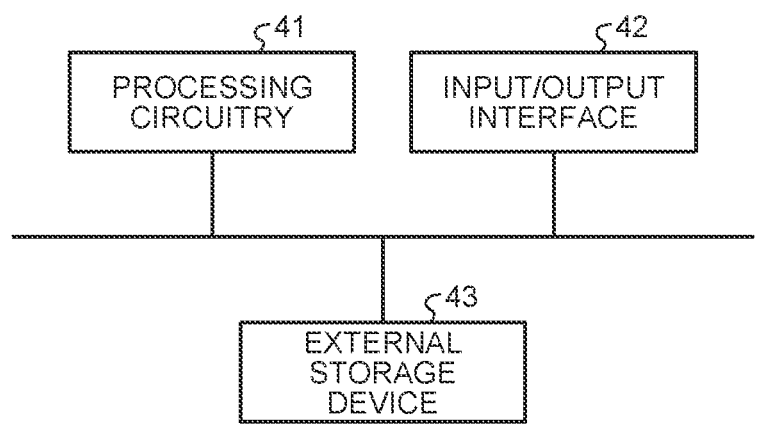
FIG. 3 illustrates criteria in the diagnosis by the anomaly diagnosis unit of the diagnostic apparatus for switching device illustrated in FIG. 1.
FIG. 4 illustrates a first example of a hardware configuration of the diagnostic apparatus for switching device according to the first embodiment.

FIG. 3 illustrates criteria in the diagnosis by the anomaly diagnosis unit of the diagnostic apparatus for switching device illustrated in FIG. 1. From the relationship between the gradients calculated by the gradient calculation unit 12 and the time, the anomaly diagnosis unit 14 determines values of "$t_{x1}$", "$g_1$", and "$t_{y1}$". The respective values of "$t_{x1}$", "$g_1$", and "$t_{y1}$" represent feature values. In the relationship between the time t and the gradient g, the value of "$t_{x1}$" denotes the time t at the inflection point where the gradient g is maximum. The value of "$g_1$" denotes the gradient g at the inflection point. In the relationship between the time t and the gradient g, the value of "$t_{y1}$" denotes the time t when the variation of the gradient g settles. The anomaly diagnosis unit 14 determines the respective values of "$t_{x1}$", "$g_1$", and "$t_{y1}$", thus extracting the feature values of the travel waveform read from the waveform storage unit 11.

Respective values of "$t_{x0}$", "$g_0$", and "$t_{y0}$" on the travel waveform $W_0$ are stored in the storage unit 13. The respective values of "$t_{x0}$", "$g_0$", and "$t_{y0}$" refer to the preset reference values. The reference values "$t_{x0}$", "$g_0$", and "$t_{y0}$" are determined and stored in the storage unit 13 when the switching device is inspected after being installed. The anomaly diagnosis unit 14 reads the respective values of "$t_{x0}$", "$g_0$", and "$t_{y0}$" stored in the storage unit 13.

When those four criteria illustrated in FIG. 3 are all satisfied, the anomaly diagnosis unit 14 determines that none of the anomalies ranging from "type A" to "type D" has occurred. A first one of the four criteria, "$t_{x1}-t_{x0}<T_1$", is used for determining whether or not "$t_{x1}$" is shifted to come after "$t_{x0}$". "$T_1$" is a preset threshold. "$T_1$" is preset taking into account the effect that errors, including a detection error of the encoder 16, may cause on the determination. When "$t_{x1}-t_{x0}<T_1$" is not satisfied, the anomaly diagnosis unit 14 determines that "$t_{x1}$" is shifted to come after "$t_{x0}$".

A second one of the four criteria, "$|g_1-g_0|<G$", is used for determining whether or not there is a difference between "$g_1$" and "$g_0$". "G" is a preset threshold. "G" is preset taking into account the effect that errors, which include the detection error of the encoder 16, may cause on the determination. When "$|g_1-g_0|<G$" is not satisfied, the anomaly diagnosis unit 14 determines that there is the difference between "$g_1$" and "$g_0$". Because the threshold "G" to be used in the determination is common to the tripping operation and the closing operation, the anomaly diagnosis unit 14 calculates an absolute value of "$g_1-g_0$" here. When a threshold to be used in the tripping operation and a threshold to be used in the closing operation are preset individually, the anomaly diagnosis unit 14 may perform determination on the basis of a value of "$g_1-g_0$" and not the absolute value of "$g_1-g_0$".

A third one of the four criteria, "$t_{y1}-t_{y0}<T_2$", is used for determining whether or not "$t_{y1}$" is shifted to come after "$t_{y0}$". "$T_2$" is a preset threshold. "12" is preset taking into account the effects that errors, which include the detection error of the encoder 16, may cause on the determination. When "$t_{y1}-t_{y0}<T_2$" is not satisfied, the anomaly diagnosis unit 14 determines that "$t_{y1}$" is shifted to come after "$t_{y0}$".

A fourth one of the four criteria, "$T_3<t_{y1}-t_{y0}$", is used for determining whether or not "$t_{y1}$" is shifted to come before "$t_{y0}$". When "$T_3<t_{y1}-t_{y0}$" is not satisfied, the anomaly diagnosis unit 14 determines that "$t_{y1}$" is shifted to come before "$t_{y0}$". In the presence of the "type D" anomaly, "$t_{y1}-t_{y0}$" is a negative number. Therefore, "$T_3$", which is a threshold, is a negative number. The anomaly diagnosis unit 14 stores respective values of "$T_1$", "$T_2$", "$T_3$", and "G" that serve as the thresholds. The travel waveform here varies depending on conditions such as ambient temperature, air or oil pressure, and control voltage. In consideration of variations in the conditions, presetting the respective thresholds of the first through fourth criteria to enable statistical anomaly determinations is desirable.

When "$t_{x1}-t_{x0}<T_1$" and "$t_{y1}-t_{y0}<T_2$" are not fulfilled while the other criteria is satisfied, a determination can be made that the travel waveform read from the waveform storage unit 11 is characteristic of "type A". When the first and third criteria are not satisfied with the second and fourth criteria satisfied, the anomaly diagnosis unit determines that the "type A" anomaly has occurred.

When "$t_{x1}-t_{x0}<T_1$", "$|g_1-g_0|<G$", and "$t_{y1}-t_{y0}<T_2$" are not fulfilled while the other criterion is satisfied, a determination can be made that the travel waveform read from the waveform storage unit 11 is characteristic of "type B". When the first, second, and third criteria are not satisfied with the fourth criterion satisfied, the anomaly diagnosis unit 14 determines that the "type B" anomaly has occurred.

When "$t_{y1}-t_{y0}<T_2$" is not fulfilled while the other criteria is satisfied, a determination can be made that the travel waveform read from the waveform storage unit 11 is characteristic of "type C". When the third criterion is not satisfied with the first, second, and fourth criteria satisfied, the anomaly diagnosis unit 14 determines that the "type C" anomaly has occurred.

When "$T_3<t_{y1}-t_{y0}$" is not fulfilled while the other criteria is satisfied, a determination can be made that the travel waveform read from the waveform storage unit 11 is characteristic of "type D". When the fourth criterion is not satisfied with the first, second, and third criteria satisfied, the anomaly diagnosis unit 14 determines that the "type D" anomaly has occurred.

Through such a determination, the anomaly diagnosis unit 14 diagnoses whether an anomaly has occurred and a factor behind the anomaly. When the anomaly diagnosis unit 14 determines that an anomaly has occurred, the anomaly diagnosis unit 14 outputs, to the output unit 15, a diagnostic result indicating that the anomaly has occurred along with information indicating a factor behind the anomaly occurred. When the anomaly diagnosis unit 14 determines that no anomaly has occurred, the anomaly diagnosis unit 14 outputs, to the output unit 15, a diagnostic result indicating that no anomaly has occurred. Confirming the diagnostic result indicating that an anomaly has occurred allows a user of the circuit breaker operating device 20 to perform maintenance for eliminating the anomaly.

In cases where the "type A" anomaly and the "type C" anomaly have occurred at the same time, the first and third criteria will not be satisfied. When the first and third criteria are not satisfied, the anomaly diagnosis unit 14 may output, to the output unit 15, information warning of a possibility that the "type C" anomaly has occurred along with a diagnostic result indicating that the "type A" anomaly has occurred. In cases where the "type B" anomaly and the "type A" or "type C" anomaly have occurred at the same time, the first, second, and third criteria will not be satisfied. When the first, second, and third criteria are not satisfied, the anomaly diagnosis unit 14 may output, to the output unit 15, information warning of a possibility that the "type A" or "type C" anomaly has occurred along with a diagnostic result indicating that the "type B" anomaly has occurred. When the anomaly diagnosis unit 14 determines that although one of the above criteria is not satisfied, none of those ranging from "type A" to "type D" is relevant, the anomaly diagnosis unit 14 may output an alarm about an anomaly that has occurred without identifying a factor.

A description is provided next of a hardware configuration of the diagnostic apparatus 10. The gradient calculation unit 12 and the anomaly diagnosis unit 14 of the diagnostic apparatus 10 are functionally implemented by use of processing circuitry. The processing circuitry is dedicated hardware installed in the diagnostic apparatus 10. The processing circuitry may be a processor that executes programs stored in a memory.

FIG. 4 illustrates a first example of the hardware configuration of the diagnostic apparatus for switching device according to the first embodiment. Illustrated in FIG. 4 is the hardware configuration in which the gradient calculation unit 12 and the anomaly diagnosis unit 14 that are illustrated in FIG. 1 are functionally implemented by use of the dedicated hardware. The diagnostic apparatus 10 includes the processing circuitry 41 that executes various processes, an input/output interface 42 that provides connection with a device external to the diagnostic apparatus 10, and an external storage device 43 that stores various kinds of information. In FIG. 4, these parts of the diagnostic apparatus 10 are interconnected via a bus.

The processing circuitry 41 serving as the dedicated hardware is a single circuit, a composite circuit, a programmed processor, a parallel programmed processor, an application-specific integrated circuit (ASIC), a field-programmable gate array (FPGA), or a combination of these. The processing circuitry 41 is used for the functional implementation of the gradient calculation unit 12 and the anomaly diagnosis unit 14.

The output unit 15 is functionally implemented by use of the input/output interface 42. The input/output interface 42 also obtains the signal from the encoder 16. The external storage device 43 is a hard disk drive (HDD) or a solid-state drive (SSD). The waveform storage unit 11 and the storage unit 13 are functionally implemented by use of the external storage device 43. It is to be noted that a display may be included in the diagnostic apparatus 10 as an output device that displays information such as the diagnostic result on a screen.

Figure 5:
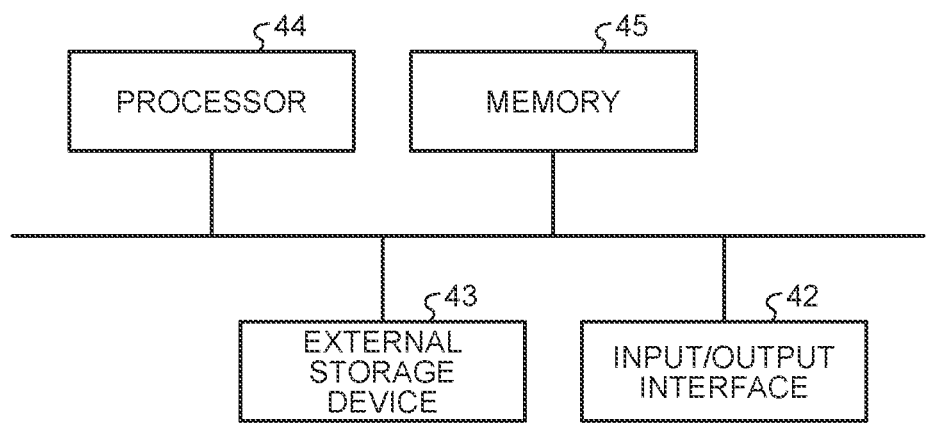
FIG. 5 illustrates a second example of the hardware configuration of the diagnostic apparatus for switching device according to the first embodiment.

FIG. 5 illustrates a second example of the hardware configuration of the diagnostic apparatus for switching device according to the first embodiment. Illustrated in FIG. 5 is the hardware configuration in which the gradient calculation unit 12 and the anomaly diagnosis unit 14 are functionally implemented by use of hardware that executes programs. A processor 44 and a memory 45 are interconnected with the input/output interface 42 and the external storage device 43.

The processor 44 is a central processing unit (CPU), a processing unit, an arithmetic unit, a microprocessor, a microcomputer, or a digital signal processor (DSP). The gradient calculation unit 12 and the anomaly diagnosis unit 14 are functionally implemented by the processor 44 and software, firmware, or a combination of software and firmware. The software or the firmware is described as the programs and is stored in the memory 45, which is a built-in memory. The memory 45 is a nonvolatile or volatile semiconductor memory such as a random-access memory (RAM), a read-only memory (ROM), a flash memory, an erasable programmable read-only memory (EPROM), or an electrically erasable programmable read-only memory (EEPROM) (registered trademark).

The diagnostic apparatus 10 according to the first embodiment includes the gradient calculation unit 12 that calculates gradients of a travel waveform, and the anomaly diagnosis unit 14 that extracts feature values from a relationship between a time and the gradients and diagnoses whether any anomalies have occurred. The diagnostic apparatus 10 does not need to obtain signals such as the control signal 24 or 25 and a signal indicating a switching between opening and closing of a non-voltage contact other than detecting the travel waveform. Moreover, the diagnostic apparatus 10 does not need to associate these signals with the travel waveform. Therefore, the diagnostic apparatus 10 enables a reduced processing load in the diagnosis.

The above configurations illustrated in the embodiment are illustrative of content of the present invention, can be combined with other techniques that are publicly known, and can be partly omitted or changed without departing from the gist of the present invention.

REFERENCE SIGNS LIST 1 circuit breaker; 10 diagnostic apparatus; 11 waveform storage unit; 12 gradient calculation unit; 13 storage unit; 14 anomaly diagnosis unit; 15 output unit; encoder; 20 circuit breaker operating device; 21 drive source; 22 mechanism; 23 damper; 24, 25 control signal; 26 operation shaft; 30 circuit breaker contact; 31 circuit; 41 processing circuitry; 42 input/output interface; 43 external storage device; 44 processor; 45 memory.

The invention claimed is:

1. A diagnostic apparatus for switching device to diagnose whether an anomaly occurs in a switching device including an operation shaft that opens and closes a contact, the diagnostic apparatus comprising:
   processing circuitry
   to calculate a gradient of a waveform indicating motion of the operation shaft, the waveform representing a relationship between a position of the operation shaft and a time that elapses since input of an operating command to the switching device; and
   to extract, from a relationship between the time and the gradient calculated, a feature value representing a motion characteristic of the operation shaft and to diagnose whether an anomaly occurs and a factor behind the anomaly that occurs, on the basis of a result of comparison between the feature value extracted and a preset reference value.

2. The diagnostic apparatus for switching device according to claim 1, wherein the feature value is a value indicating the time at an inflection point where the gradient is maximum in the relationship between the time and the gradient.

3. The diagnostic apparatus for switching device according to claim 1, wherein the feature value is a value indicating the gradient at an inflection point where the gradient is maximum in the relationship between the time and the gradient.

4. The diagnostic apparatus for switching device according to claim 1, wherein the feature value is a value indicating the time when variation of the gradient settles in the relationship between the time and the gradient.

* * * * *